(12) United States Patent
Steinle

(10) Patent No.: US 6,255,676 B1
(45) Date of Patent: Jul. 3, 2001

(54) CHARGE COUPLED DEVICE WITH NONREFLECTIVE COATING

(75) Inventor: Michael J Steinle, Ft Collins, CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/343,642

(22) Filed: Jun. 30, 1999

(51) Int. Cl.⁷ .................................................. H01L 27/14
(52) U.S. Cl. .......................... 257/215; 257/222; 257/226; 257/228; 257/243; 257/294; 257/297
(58) Field of Search ..................... 257/215, 222, 257/226, 228, 243, 294, 297

(56) References Cited

U.S. PATENT DOCUMENTS

| | | |
|---|---|---|
| 4,926,041 | 5/1990 | Boyd et al. .......................... 250/226 |
| 5,227,620 | 7/1993 | Elder, Jr. et al. ..................... 250/208 |
| 5,323,052 * | 6/1994 | Koyama ................................ 257/294 |
| 5,410,347 | 4/1995 | Steinle et al. ........................ 348/270 |
| 6,069,376 * | 5/2000 | Merrill ................................. 257/294 |

OTHER PUBLICATIONS

Solid State Imaging with Charge–Coupled Devices of Albert J.P. Theuwissen, Kluwer Academic Publishers, First Edition 1995, pp. 46, 196, 238–239, 305.
Modern Plastics Encyclopeida 99 published by Modern Plastics, P.O. Box 602, Hightstown, New Jersey 08420, Cover, A2–A12 and C52–C62.

* cited by examiner

*Primary Examiner*—Fetsum Abraham

(57) ABSTRACT

A CCD assembly comprising: a semiconductor chip having a first face surface; an active light sensitive region located on the first face surface; an inactive region located on the first face surface next adjacent the active region; and a nonreflective coating applied over at least a portion of the inactive region.

12 Claims, 5 Drawing Sheets

CHARGE COUPLED DEVICE WITH NONREFLECTIVE COATING

FIELD OF THE INVENTION

The present invention relates generally to charge coupled devices and, more particularly, to charge coupled devices having nonreflective coatings provided adjacent to light sensitive regions thereon.

BACKGROUND OF THE INVENTION

Charge coupled devices ("CCD's") are widely used in digital imaging devices such as optical scanners, fax machines, digital copiers, video cameras and digital cameras. CCD's are solid state devices formed using semiconductor fabrication processes well known in the art. See, for example, Solid State Imaging with Charge-Coupled Devices by Albert J. P. Theuwissen, Kluwer Academic Publishers, First Editionl 995, which is hereby incorporated by reference.

CCD's of the type used in scanning type imaging devices have a series of small photosensor elements or "pixels" positioned in a closely spaced linear array. (These photosensor elements are sometimes referred to as the "active" area of the CCD.) An imaging light beam from a scan line portion of the object is imaged onto this photosensor array. The imaging is typically done by a lens assembly having a substantial image reduction ratio, such that the image projected onto the linear photosensor array is much smaller, e.g., ten times smaller than the corresponding scan line portion of the object. Each pixel of the CCD generates an electronic data signal representative of the intensity of the light that is impinged thereon during a short period of time known as a sampling interval. In order for a CCD pixel to generate an accurate image it is necessary that it receive imaging light only from the corresponding portion of the object which is imaged. Any stray light (photons) which strikes the pixel during a sampling interval will result in a degradation of the image data generated by the pixel during that sampling interval. This degradation of the data, in turn, may cause blurring, ghosting or other image artifact in any image generated from the data. Blurring image degradation is referred to in the art as decreased MTF (modulation transfer function).

One way that stray photons enter a photosensor element is for light from a source other than the imaging light beam to strike a portion of the CCD adjacent to the photosensor element and reflect onto it. In color scanning devices having multiple closely positioned linear arrays the source of such stray photons is often an overlapping portion of the imaging light beam for an adjacent linear array. For example, in a color imaging device having a red, green, and blue linear sensor arrays provided on a single CCD, a portion of the red imaging beam may reflect off a region positioned close enough to the green sensor array to cause light from the red imaging beam to improperly enter the green linear sensor array.

One known technique for reducing the amount of stray light from adjacent imaging beams is to provide a microlens above each linear array using a clear plastic which is fabricated using conventional photolithography methods. The microlens helps to converge the imagining light beam onto the proper linear sensor array but does not entirely eliminate the problem of stray light from an adjacent imaging beam entering the wrong linear sensor array.

Light striking a CCD in regions other than the photosensor elements has also been known to cause problems. For example, light striking certain conductor regions formed adjacent to the photosensor regions has been known to cause errors in the data transmitted by the conductors. One way of eliminating this problem has been to cover the conductors with a light reflective photoshield which reflects light away from the conductors. Such photoshields may however have the effect of increasing the amount of stray light which is reflected onto the photosensor.

It would be generally desirable to provide a CCD assembly which reduces the amount of stray light which enters the respective photosensor elements thereof.

SUMMARY OF THE INVENTION

The present invention is directed to a CCD assembly which is provided with means for reducing the impingement of stray light on the active areas of the CCD.

Thus, the invention may comprise a CCD assembly including a semiconductor chip having a first face surface; at least one light sensitive ("active") region located on the first face surface; at least one inactive region located on the first face surface next adjacent the active region; and a nonreflective coating applied over at least a portion of the inactive region.

The invention may also comprise a method of improving MTF in image data produced by a CCD assembly including providing a nonreflective material and coating at least an inactive region of the CCD assembly positioned next adjacent to an active region of the CCD assembly with the nonreflective material.

The invention may also comprise a method of obtaining improved MTF in an image of an object produced from data from a CCD assembly including focusing imaging light reflected from the object onto an active area of the CCD assembly and preventing light incident on an inactive area of the CCD assembly next adjacent to the active area from reflecting onto the active area.

The invention may also comprise an optical scanner including an imaging assembly and a CCD assembly having a semiconductor chip with a first face surface; at least one active region located on the first face surface and positioned to receive an imaging light beam produced by said imaging assembly; an inactive region located on the first face surface next adjacent the active region; and a nonreflective coating applied over at least a portion of the inactive region.

DETAILED DESCRIPTION OF THE INVENTION

Figure 3:
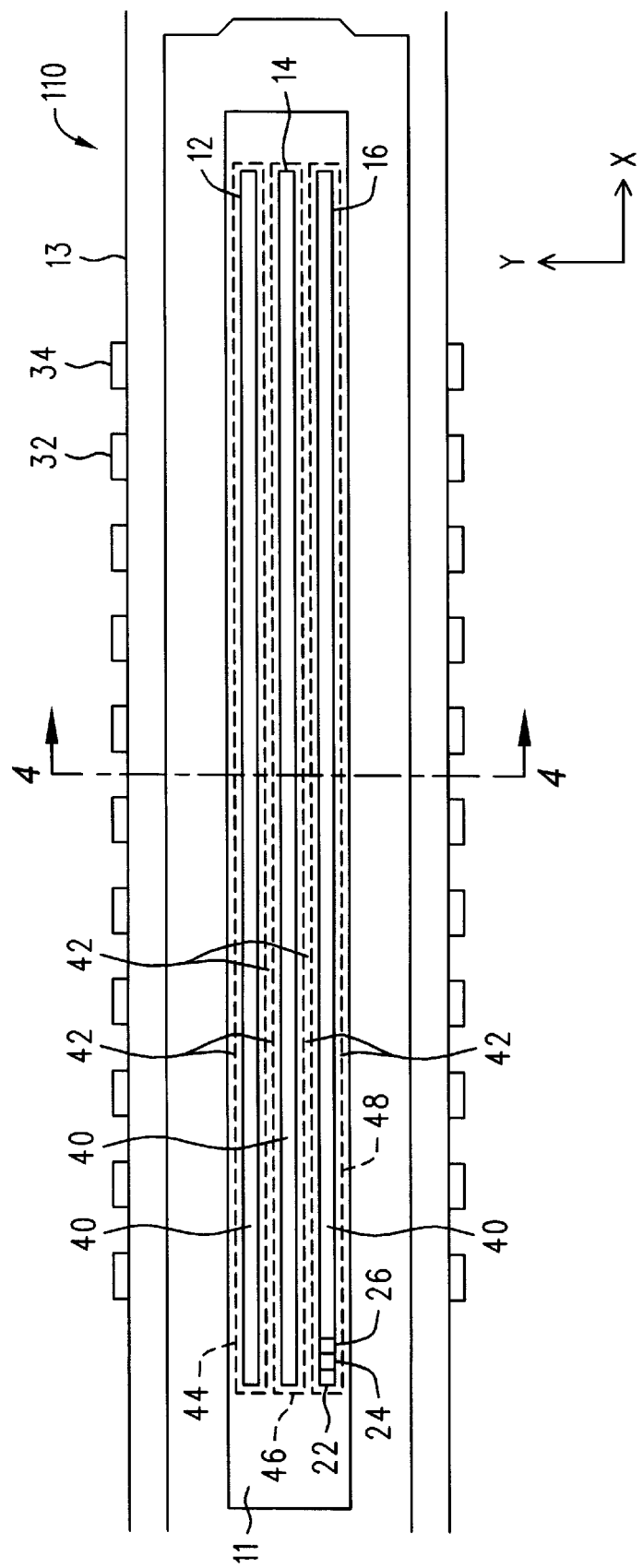
FIG. 3 is a top plan view of a CCD assembly.
Figure 4:
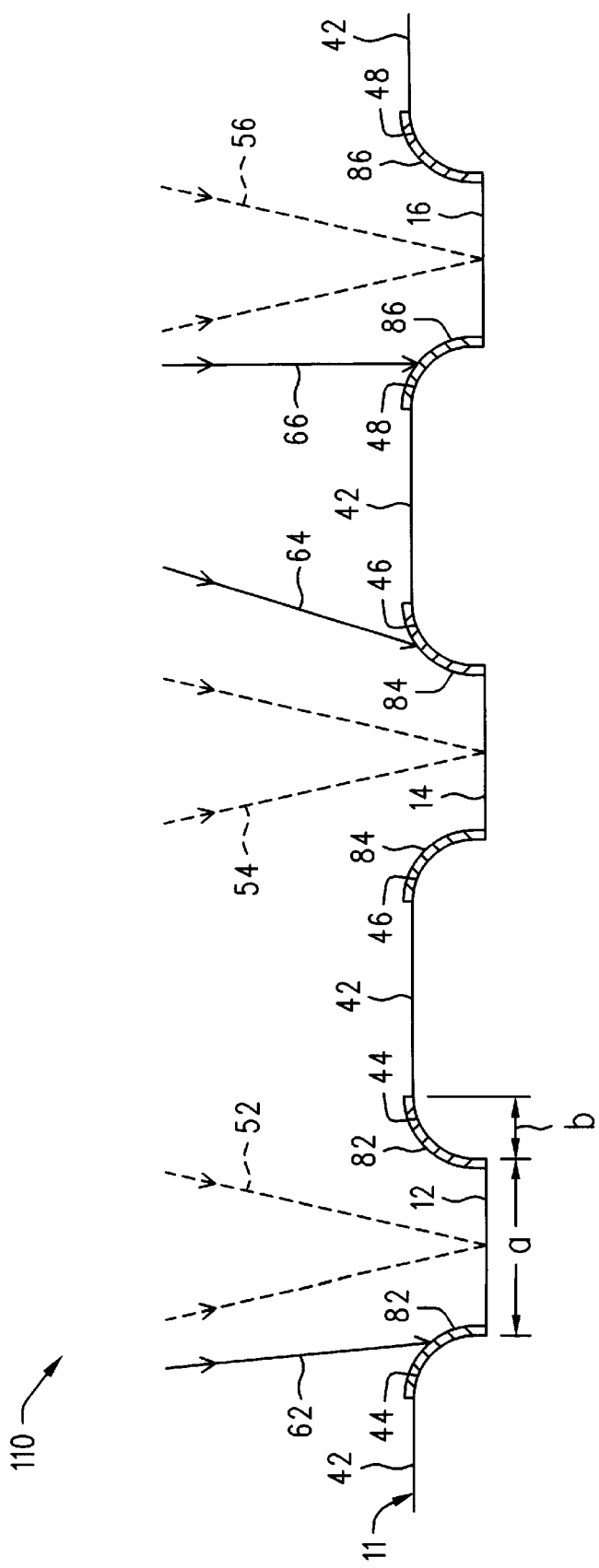
FIG. 4 is a cross sectional view of a CCD assembly.
Figure 5:
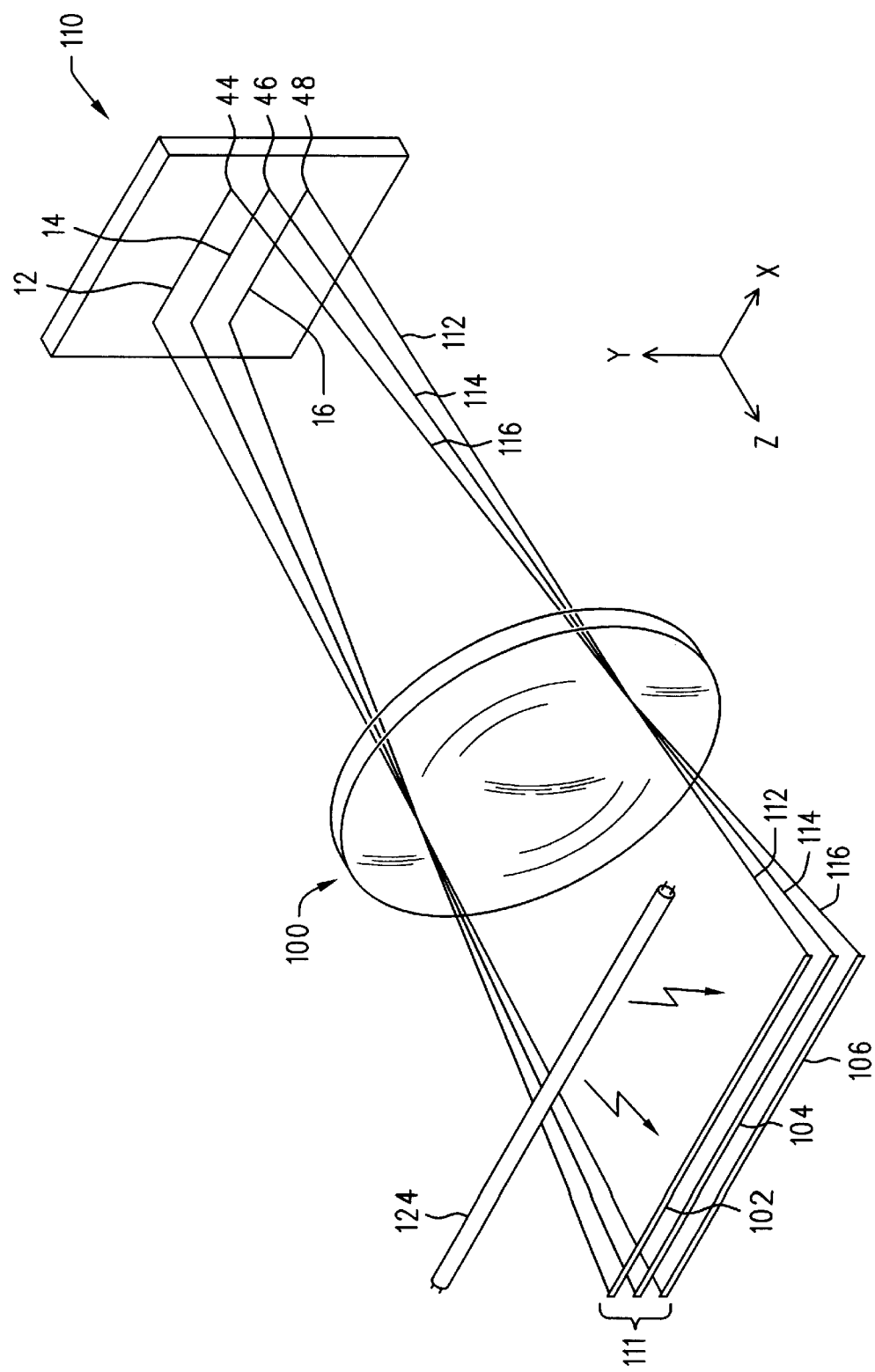
FIG. 5 is a schematic view of an optical scanner.

FIGS. 3–5, in general, illustrate a CCD assembly 110 comprising a semiconductor chip 13 having a first face surface 11; at least one active (light sensitive) region 40 located on the first face surface; at least one inactive region 42 located on the first face surface 11 next adjacent the active region 40; and a nonreflective coating 82 applied over at least a portion 44 of the inactive region 42. Having thus described a CCD assembly of the present invention in general, further specific description thereof, and of a related CCD assembly having problems overcome by the present invention, will now be made.

Figure 1:
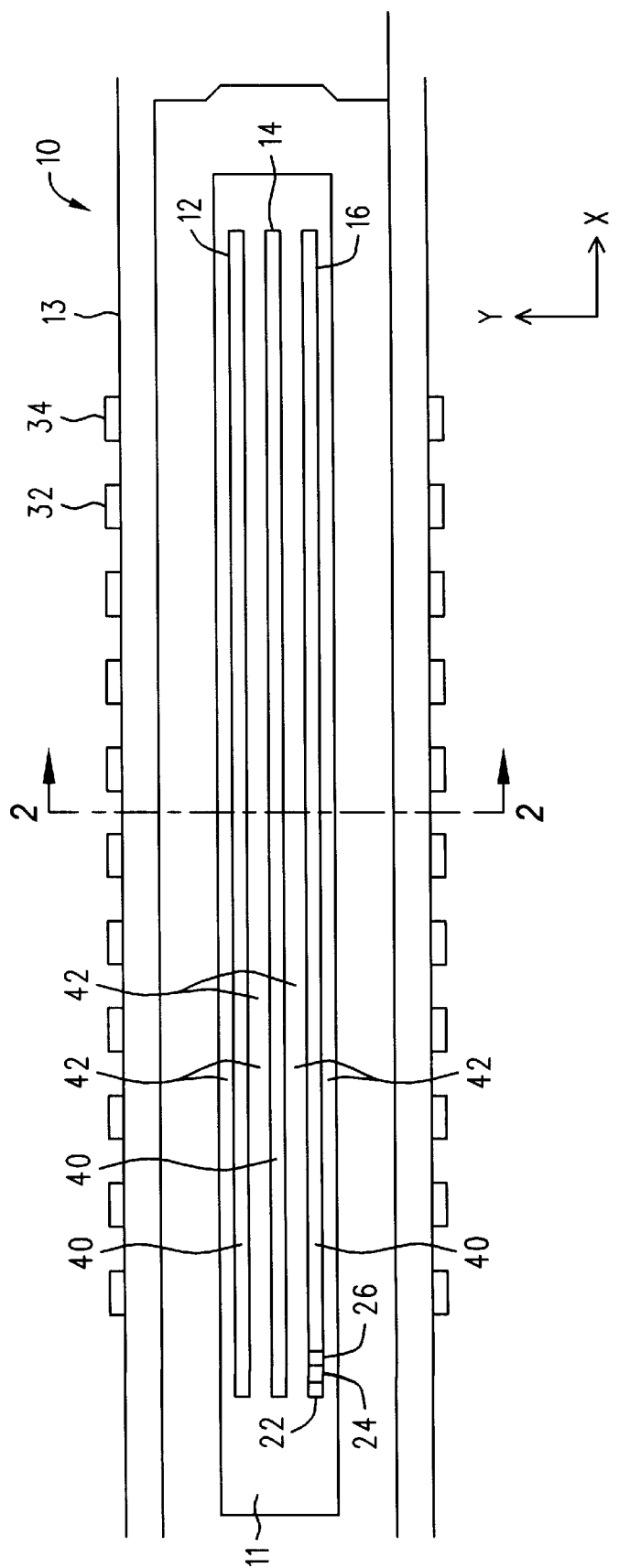
FIG. 1 is a top plan view of a CCD assembly.
Figure 2:
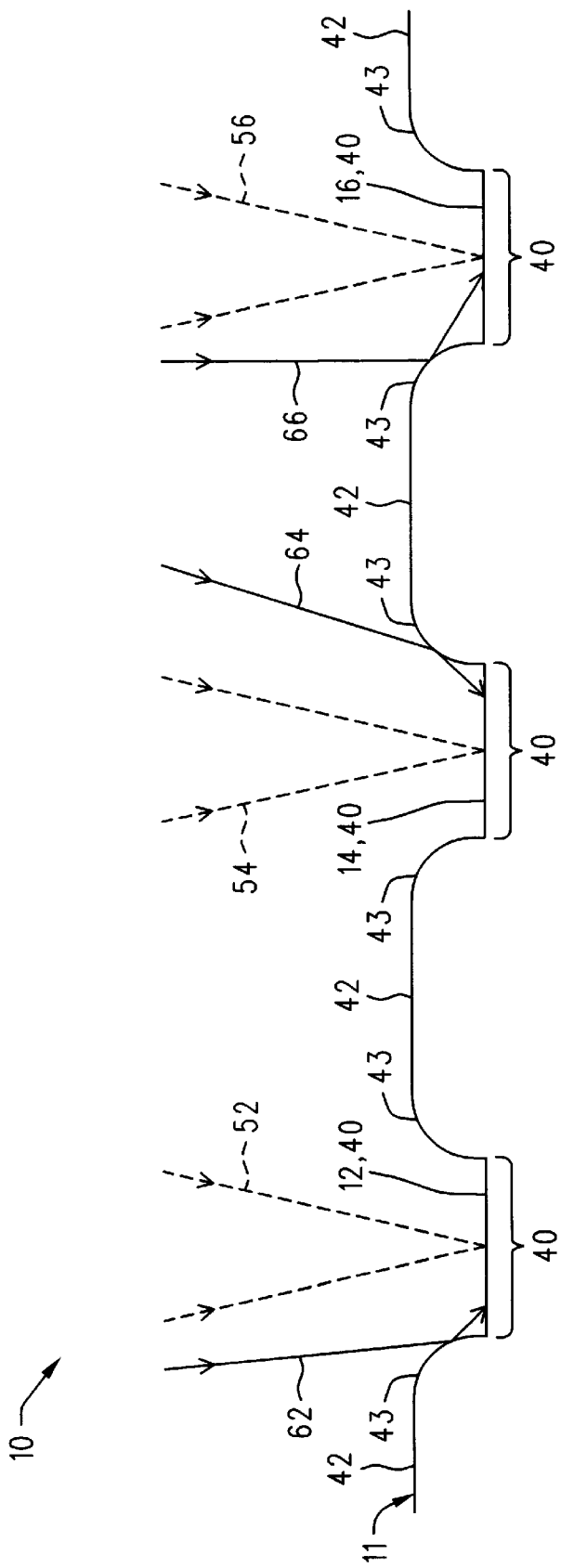
FIG. 2 is a cross sectional view of a CCD assembly.

FIG. 1 is a top plan view of a conventional CCD assembly 10. The CCD assembly is formed from a semiconductor chip 13 which has a top face portion 11 having three linear photosensor arrays 12, 14, 16 positioned thereon in parallel alignment for sensing light from red, green, and blue imaging light beams 52, 54, 56, respectively as shown in FIG. 2. Each linear photosensor array 12, 14, 16 further comprises a plurality of individual photosensor elements 22, 24, 26, etc. Each photosensor element converts light into an electronic signal representative of the intensity of the light impinged on that element during a sampling interval of the CCD. Electronic contacts 32, 34 provide electrical connection to additional electronics for signal processing, storage, or printing.

The top face 11 may be divided functionally into light sensitive or "active" areas represented by the linear arrays 12, 14, 16, and non light sensitive or "inactive" areas 42. The inactive areas 42 include the remainder of the surface of top face 11. Each active area 12, 14, 16 is circumscribed by an inactive area 42.

FIG. 2 is a blown up cross sectional view of the CCD assembly 10 of FIG. 1. FIG. 2 illustrates that the inactive areas include shoulder areas 43 positioned next adjacent to the active areas 40 on each side thereof. The shoulder areas 43 generally resemble the rounded banks of a river or stream. FIG. 2 also illustrates the convergent wedges of red, green, and blue imaging light beams 52, 54, 56, which are impinged on linear arrays 12, 14, 16, respectively, during a color optical scanner scanning operation. Color optical scanner operations and structures are disclosed in U.S. Pat. No. 5,227,620 issued Jul. 13, 1993 for APPARATUS FOR ASSEMBLING COMPONENTS OF COLOR OPTICAL SCANNERS of C. William Elder, Jr. Michael J. Steinle, and Duane L. Starner; U.S. Pat. No. 5,410,347 issued Apr. 25, 1995 for COLOR OPTICAL SCANNER WITH IMAGE REGISTRATION HOLDING ASSEMBLY of Michael J. Steinle, Steven G. Henry, Dean Buck and Jerry L. Bybee; and U.S. Pat. No. 4,926,041, issued May 15, 1990 for OPTICAL SCANNER of David W. Boyd, Steven L. Webb and Michael J. Steinle which are hereby incorporated by reference for all that is disclosed therein. FIG. 2 also depicts stray light rays 62, 64,66 which are incident on linear arrays 12, 14, 16 respectively as a result of reflection from inactive areas 43 positioned next adjacent to each of the active areas 40. The stray light rays 62, 64, 66 may be from adjacent image beams 52, 54, 56 or other sources.

FIGS. 3 and 4 illustrate a CCD assembly 110 which is the same CCD assembly 10 shown in FIGS. 1 and 2 except that a nonreflective coating 82,84,86 has been applied to portions 44,46,48 of the nonactive areas next adjacent to each linear sensor array 12, 14, 16. Stray light, e.g. 62, 64, 66 is absorbed by the nonreflective coating. As used herein "nonreflective coating" is to be understood to mean substantially nonreflective, i.e. absorbing more than about 80% of the light incident thereon. In one preferred embodiment the coatings 82, 84, 86 and associated portions 44, 46, 48 have a lateral dimension "b" extending away from each associated active area about one half to two times the lateral dimension "a" of the active area. (In alternative embodiments the coatings 82, 84, 86 may be applied over a much larger portion of each of the inactive areas 42 or all of the inactive areas.) In the preferred embodiment the coatings are formed from acrylic plastic having a nonreflective or substantially nonreflective pigment combined therewith. In an alternative embodiment the pigment for coatings would absorb only light of the wavelength of light impinged on the next adjacent photosensor array. For example, if the green light photosensor array were positioned between the red and blue light sensor arrays the pigment of the coating on the side of the green array positioned next to the red array would be blue and on the other side would be red. Thus coating 84 would be red on the left side shown in FIG. 4 and blue on the right side. The application of plastic coating and the coloring thereof with pigments of various colors is well known in the art and the various plastics, such as acrylic and the pigments to be provided therein are known in the art and commercially available. See, for example, Modern Plastics Encyclopedia 99 published by Modem Plastics P.O. Box 602 Hightstown, N.J. 08520, which is hereby incorporated by reference. In the preferred embodiment the nonreflective coating is applied by a conventional photolithographic process, such as that used in microlens formation, which is well known in the art. See Theuwissen, supra. The thickness of each coating is preferably between about 1 micron (micro millimeter) and 10 microns and most preferably between about 3 microns and 5 microns.

In another embodiment each coating 82, 84, 86 is a dye which is applied directly to the inactive areas 44, 46, 48 in the same manner that optical filter dyes are applied to active regions of a photosensor when color filters are required. The manner by which dye patterns are applied to a photosensor region of a CCD is well known in the art.

FIG. 5 is a schematic illustration of a color optical scanner using the CCD assembly 110 described above with reference to FIGS. 3 and 4. The scanner optical system may comprise an imaging lens assembly 100 and an object illumination source 124. Three scan line portions 102, 104, 106 of an object 111 are imaged via red, green and blue imaging light beams 112, 114, 116 onto the three linear arrays 12, 14, 16 of CCD assembly 110. The nonreflective coating 82, 84, 86 provided about the periphery of each linear photosensor array 12, 14, 16 help prevent stray light from entering the respective photosensor arrays, thereby improving the MTF thereof. The CCD assembly generates electronic data representative of the light impinged thereon which is subsequently stored in the memory of the scanner or attached computer or is processed by an associated processor of the scanner or attached computer or is sent to a printer or display device for generating an image of the scanned object. The CCD assembly 110 could be used in any three color scanner including those described in the above referenced patents. Also, the use of nonreflective coatings about the periphery of an active area of a CCD may be implemented in a two dimensional photosensor array (not shown).

It is contemplated that the inventive concepts herein described may be variously otherwise embodied and it is intended that the appended claims be construed to include the alternative embodiments of the invention except insofar as limited by the prior art.

What is claimed is:

1. A CCD assembly comprising:

a semiconductor chip having a first face surface;

an active light sensitive region located on said first face surface;

an inactive region located on said first face surface next adjacent said active region;

a nonreflective coating applied over at least a portion of said inactive region.

2. The CCD assembly of claim 1, wherein said nonreflective coating comprises plastic.

3. The CCD assembly of claim 2, wherein said coating further comprises pigment.

4. The CCD assembly of claim 1, wherein said nonreflective coating comprises a dye.

5. The CCD assembly of claim 1, wherein said nonreflective coating has a thickness of between about 1 and 10 micromillimeters.

6. The CCD assembly of claim 1, wherein said nonreflective coating has a thickness of between about 3 and 5 micromillimeters.

7. The CCD assembly of claim 3, wherein said nonreflective coating has a thickness of between about 1 and 10 micromillimeters.

8. The CCD assembly of claim 3, wherein said nonreflective coating has a thickness of between about 3 and 5 micromillimeters.

9. The CCD assembly of claim 4, wherein said nonreflective coating has a thickness of between about 1 and 10 micromillimeters.

10. The CCD assembly of claim 4, wherein said nonreflective coating has a thickness of between about 3 and 5 micromillimeters.

11. An optical scanner comprising:
an imaging assembly and
a CCD assembly comprising:
  a semiconductor chip having a first face surface;
  at least one active light sensitive region located on said first face surface;
  an inactive region located on said first face surface next adjacent said active region;
  a nonreflective coating applied over at least a portion of said inactive region.

12. The Optical scanner of claim 11 wherein said at least one active region comprises three linear photosensor arrays and wherein a nonreflective coating is applied to at least a portion of an inactive region surrounding each of said linear arrays.

* * * * *